United States Patent
Suzuki (10) Patent No.: US 6,704,384 B1
(45) Date of Patent: Mar. 9, 2004

(54) PHASE ADJUSTING CIRCUIT AND SEMICONDUCTOR MEMORY INCORPORATING THE SAME

(75) Inventor: Misao Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 634 days.

(21) Appl. No.: 09/618,042

(22) Filed: Jul. 17, 2000

(30) Foreign Application Priority Data

Jul. 16, 1999 (JP) .......................................... 11-203463

(51) Int. Cl.[7] .............................................. H04L 23/00
(52) U.S. Cl. ............................ 375/377; 327/291; 327/2
(58) Field of Search ................................ 375/371, 377; 370/516, 517; 330/252; 327/2, 5, 306, 307, 291

(56) References Cited

U.S. PATENT DOCUMENTS

| | | | |
|---|---|---|---|
| 6,265,903 B1 * | 7/2001 | Takahashi | 327/7 |
| 6,417,715 B2 * | 7/2002 | Hamamoto et al. | 327/291 |
| 2001/0052808 A1 * | 12/2001 | Hamamoto et al. | 327/291 |
| 2002/0053933 A1 * | 5/2002 | Takahashi | 327/278 |
| 2002/0057122 A1 * | 5/2002 | Takahashi | 327/278 |

* cited by examiner

Primary Examiner—Jean B. Corrielus
(74) Attorney, Agent, or Firm—McGinn & Gibb, PLLC (57) ABSTRACT

A phase adjusting circuit for a semiconductor memory includes a D/A converter 20 which includes a D/A converting circuit 31 receiving code signals A1 to An, and a current mirror circuit 32 having an input transistor P1 connected to an output node S of the D/A converting circuit 31 and an output transistor P2 for supplying an output current Iout. A switch circuit 34 is connected between a gate of the input transistor P1 and a gate of an output transistor P2, and a capacitor 36 is connected to the gate of an output transistor P2. The switch circuit 34 is turned off before the code signals A1 to An applied to the D/A converting circuit 31 change, and after a fluctuation of the potential on the output node S of the D/A converting circuit 31 has been settled, the switch circuit 34 is turned on, with the result that a hazard occurring in the D/A converting circuit 31 is prevented from being transferred to the current mirror circuit 32. When the switch circuit 34 is in an off condition, the capacitor 36 holds the potential before the code signals A1 to An changes, so that the output current Iout before the code signals A1 to An changes, is maintained.

8 Claims, 6 Drawing Sheets

PHASE ADJUSTING CIRCUIT AND SEMICONDUCTOR MEMORY INCORPORATING THE SAME

BACKGROUND OF THE INVENTION

The present invention relates to a phase adjusting circuit and a semiconductor memory incorporating the same, and more specifically to a phase adjusting circuit for adjusting the phase of a clock signal to the phase of a read/write data signal, and a semiconductor memory internally comprising the same.

In a semiconductor memory configured to transfer a read/write data in a time division manner, data is received and transmitted in synchronism with a clock signal. In this type of semiconductor memory, since the read/write data is transferred in the time division manner, the number of signal lines has been remarkably reduced.

When the clock signal is used, a clock skew becomes a problem. In order to reduce the clock skew, it becomes necessary to adjust the phase of the clock signal supplied to an internal circuit. Under this circumstance, it is an ordinary practice to provide a phase adjusting circuit in the semiconductor memory.

For example, in a Rambus DRAM, an internal clock signal supplied to data output circuits is phase-adjusted so as to phase-match a plurality of data output signals to one another. In the Rambus DRAM, furthermore, the internal clock signal supplied to the data output circuits is phase-adjusted to synchronize an outputting timing of an output data with a predetermined active edge of an external clock signal in order to apparently realize a high speed access.

In order to adjust the phase of the internal clock signal as mentioned above, it is sufficient if a phase adjusting circuit compares the phase of the external clock signal supplied from an external circuit with the phase of a dummy output signal. This dummy output signal is generated by a dummy output circuit which receives and delays the internal clock signal by the same time as a delay time from the moment the output circuit receives the internal clock signal to the moment the output circuit actually outputs the data signal. The phase of the external clock signal is compared with the phase of the dummy output signal, and the internal clock is generated to make the phase of the external clock signal coincident with the phase of the dummy output signal, so that the phase of the external clock signal will be coincident with the phase of the data output signal.

The condition for generating the internal clock signal as mentioned above, is expressed by a digital code, which is then converted into an analog value. The internal clock is delayed by the required amount corresponding to the analog value, and the delayed internal clock is supplied to the data output circuits, so that the phase of the external clock signal is matched with the phase of the data output signal.

However, at the time of adjusting the phase of the internal clock signal, many signals of the digital code changes at one time, so that a noise occurs. Because of this noise, the timing of the internal clock signal is temporarily greatly deviated in some cases. As a result, there occurs possibility that not only the internal clock signal having a desired phase cannot be obtained, but also the duty ratio of the internal clock is deteriorated, so that necessary setup time and hold time cannot be ensured in a circuit supplied with the internal clock signal, with the result that an expected operation is not carried out and a malfunction occurs.

BRIEF SUMMARY OF THE INVENTION

Accordingly, it is an object of the present invention to provide a phase adjusting circuit which has overcome the above mentioned problems of the prior art.

Another object of the present invention is to provide a phase adjusting circuit capable of stably adjusting the phase without being influenced by noises occurring in the phase adjustment.

The above and other objects of the present invention are achieved in accordance with the present invention by a phase adjusting circuit comprising a differential amplifier receiving an external input signal and having a controllable current source, a delay means for delaying an output signal of the differential amplifier by a predetermined length of time, a comparator for phase-comparing the external input signal with the output signal delayed by the delay means, a digital code generating circuit receiving a comparison result from the comparator for generating a digital code composed of a plurality of bits, and a D/A converter receiving the digital code for generating a control signal to the controllable current source, wherein the D/A converter outputs a first control signal corresponding to a first digital code outputted from the digital code generating circuit, and when the first digital code changes to a second digital code, the D/A converter maintains the first control signal for a predetermined period of time, and then, outputs a second control signal corresponding to the second digital code after the predetermined period of time has elapsed.

According to another aspect of the present invention, there is provided a semiconductor memory comprising a memory cell array, a phase adjusting circuit receiving an external clock signal to generate an internal clock signal and having the function for adjusting the phase of the internal clock signal, a data outputting circuit for outputting data from the memory cell array in response to the internal clock signal, the phase adjusting circuit including a differential amplifier receiving the external clock signal to output the internal clock signal and having a controllable current source, a delay means for delaying the internal clock signal outputted from the differential amplifier by a delay time of the data outputting circuit, a comparator for phase-comparing the external clock signal with the internal clock signal delayed by the delay means, a digital code generating circuit receiving a comparison result from the comparator for generating a digital code composed of a plurality of bits, and a D/A converter receiving the digital code for generating a control signal controlling the controllable current source of the differential amplifier, wherein the D/A converter outputs a first control signal corresponding to a first digital code outputted from digital code generating circuit, and when the first digital code changes to a second digital code, the D/A converter maintains the first control signal for a predetermined period of time, and then, outputs a second control signal corresponding to the second digital code after the predetermined period of time has elapsed.

The above and other objects, features and advantages of the present invention will be apparent from the following description of preferred embodiments of the invention with reference to the accompanying drawings.

DETAILED DESCRIPTION OF THE INVENTION

Figure 1:
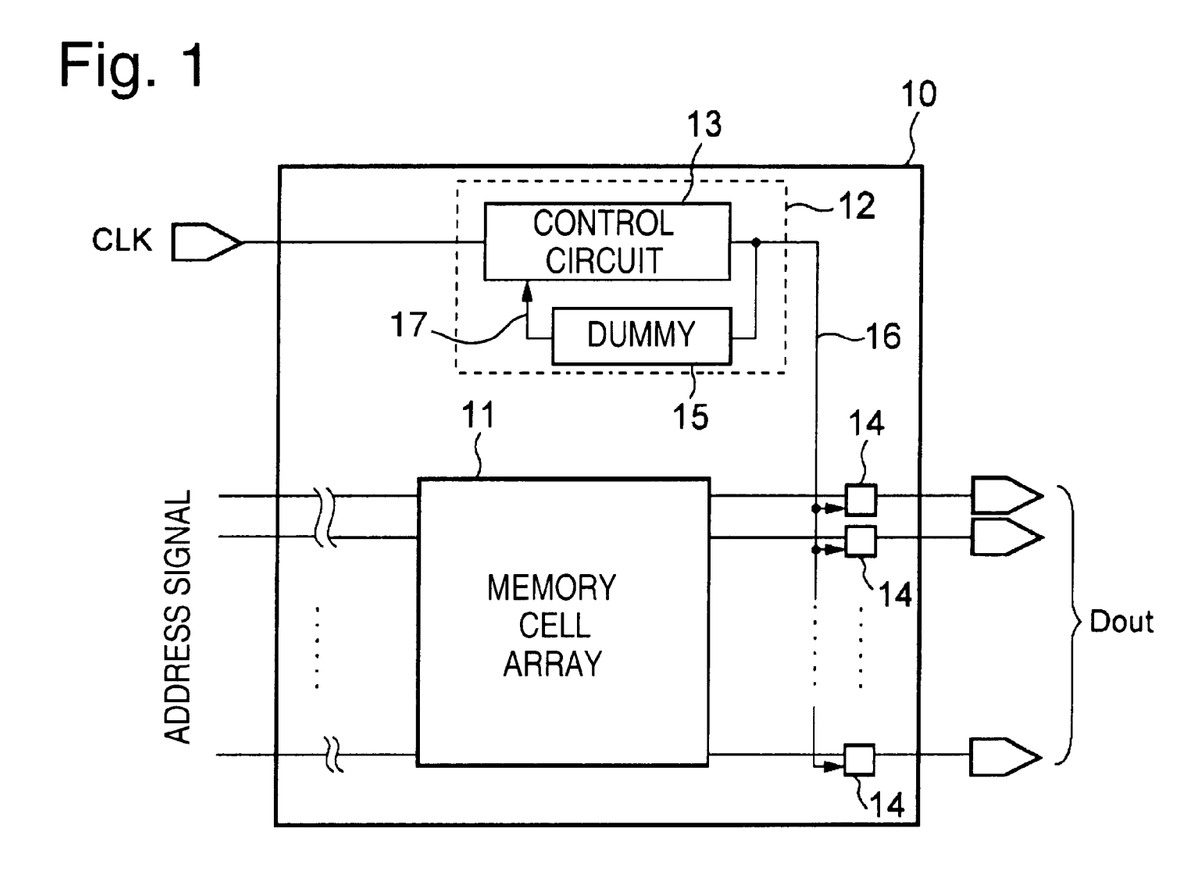
FIG. 1 is a block diagram of an embodiment of the semiconductor memory in accordance with the present invention.

Referring to FIG. 1, there is shown a block diagram of an embodiment of the semiconductor memory in accordance with the present invention. For simplification of the drawing, only portions in connection the phase adjustment for a data outputting are shown in FIG. 1. Actually, a phase adjusting circuit is provided for a clock signal supplied to an input circuit (not shown), but is omitted also for simplification of the drawing.

In FIG. 1, the semiconductor memory is generally designated with the reference number 10. The semiconductor memory 10 includes a memory cell array 11, a phase adjusting circuit 12 and a plurality of data output circuits 14. An address signal is supplied, and a read-out data is outputted through the plurality of data output circuits 14 to a corresponding number of data output terminals Dout. An external clock signal CLK is supplied to the phase adjusting circuit 12, which generates an internal clock signal 16 to all the data output circuits 14

The phase adjusting circuit 12 includes a control circuit 13 receiving the external clock signal CLK and generating the internal clock signal 16, and a dummy circuit 15 receiving the internal clock signal 16 for generating a dummy output signal 17 which is obtained by delaying the internal clock signal 16 by the same time as a delay time from the moment the data output circuits 14 receive the internal clock signal 16 to the moment the data output circuits 14 output the data to the data output terminals Dout.

Figure 2:
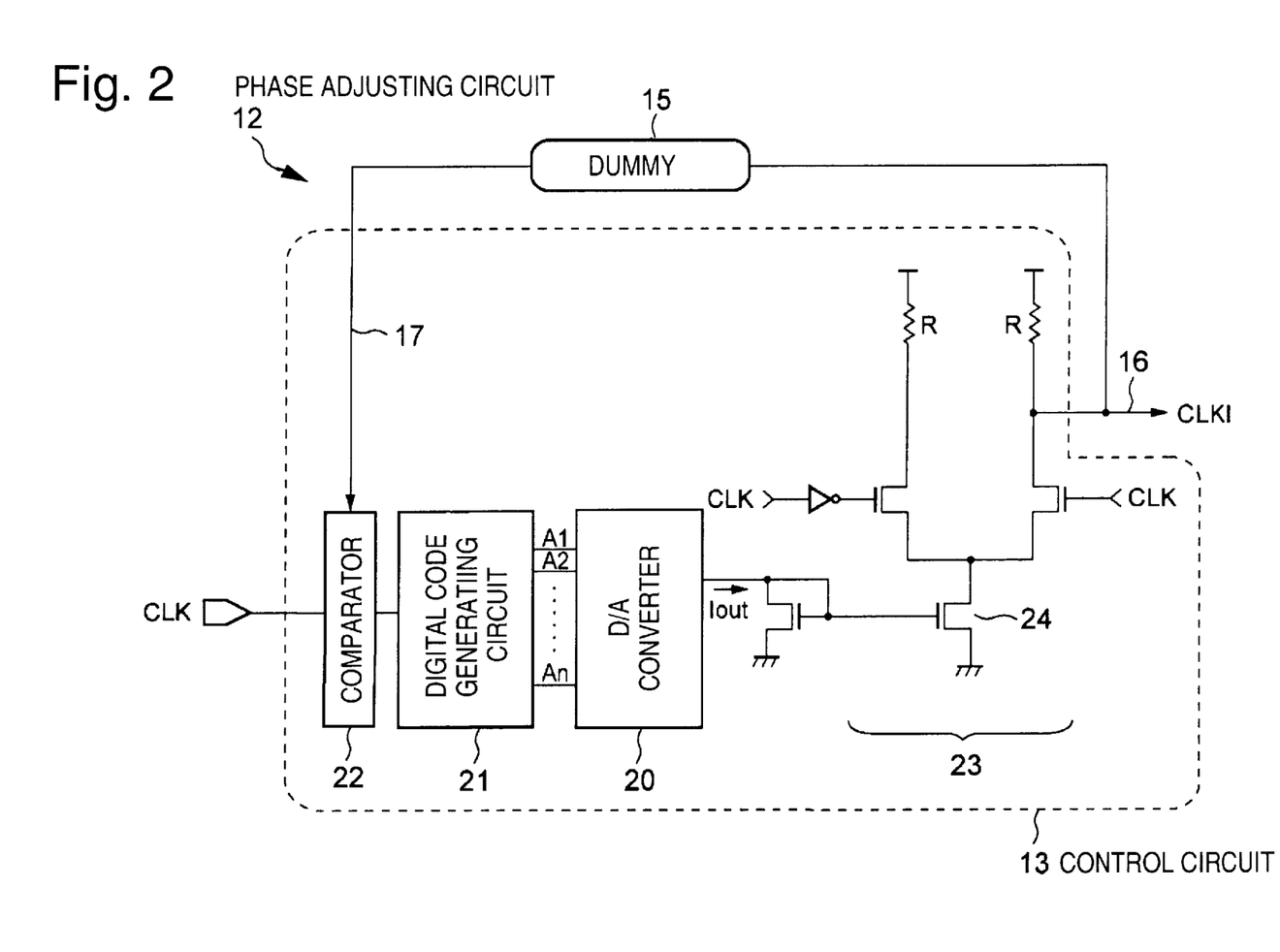
FIG. 2 is a block diagram of an embodiment of the phase adjusting circuit in accordance with the present invention.

Referring to FIG. 2, there is shown a block diagram of an embodiment of the phase adjusting circuit 12. As shown in FIG. 2, the control circuit 13 provided in the phase adjusting circuit 12 includes a comparator 22 for comparing the phase of the external clock signal CLK with the phase of the dummy output signal 17, a digital code generating circuit 21 receiving a comparison result from the comparator 22, for generating an n-bit digital code composed of code signals A1 to An, a D/A converter 20 receiving the code signals A1 to An, to output an electric current Iout corresponding to the digital code expressed by the code signals A1 to An, and a differential amplifier 23 having a current source 24 controlled by a current mirror circuit receiving the electric current Iout as an input current.

The differential amplifier 23 has a circuit construction, as shown in FIG. 2, to receive the external clock signal CLK and an inverted signal of the external clock signal CLK and to adjust a driving capability of the internal clock signal (CLKI) 16 supplied to the data output circuits 14, on the basis of the value of the current flowing through the current source 24. In other words, the phase of the internal clock signal (CLKI) 16 is adjusted by the driving capability of the internal clock signal (CLKI) 16. The internal clock signal (CLKI) 16 is supplied to the dummy circuit 15 having the same delay as that of the data output circuits 14, so that the phase of the external clock signal CLK is compared with the phase of the dummy output signal 17 by means of the comparator 22, and the digital code generating circuit 21 generates the digital code expressed by the code signals A1 to An corresponding to the result of comparison, and then, the D/A converter 20 outputs an analog current Iout corresponding to the digital code expressed by the code signals A1 to An.

Before describing the phase adjusting circuit in accordance with the present invention, a prior art phase adjusting circuit which is not improved in accordance with the present invention, will be described with reference to FIG. 6 which is a circuit diagram of a D/A converter incorporated in the prior art phase adjusting circuit.

Figure 6:
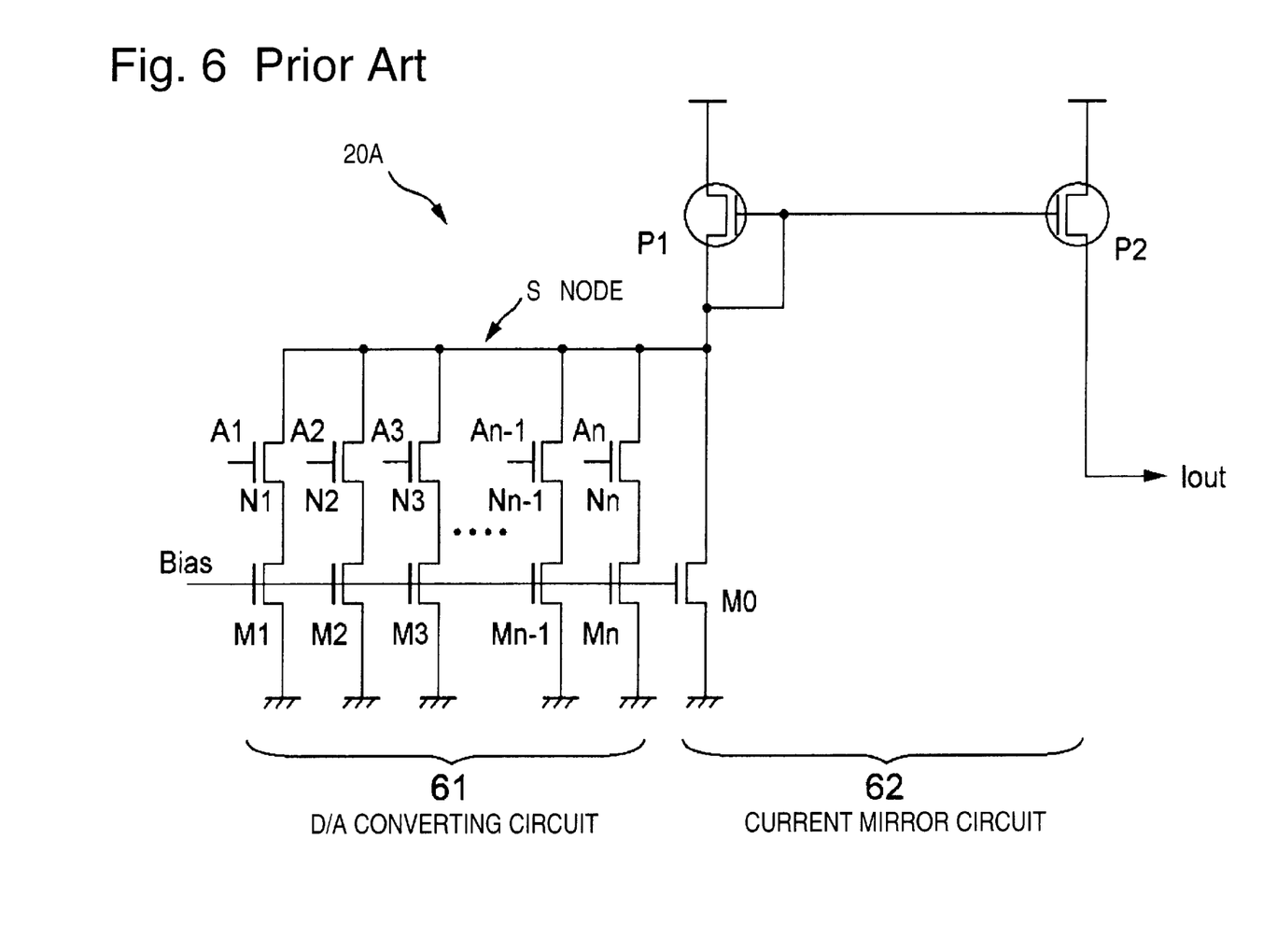
FIG. 6 is a circuit diagram of a prior art D/A converter.

In FIG. 6, the D/A converter is generally designated with the reference number 20A, and the prior art phase adjusting circuit is obtained by replacing the D/A converter 20 in the phase adjusting circuit shown in FIG. 2 with the D/A converter 20A shown in FIG. 6

As shown in FIG. 6, the D/A converter 20A includes a D/A converting circuit 61 for converting the code signals A1 to An to a current flowing through a node S, and a current mirror circuit 62 for outputting the current Iout in accordance with the value of the current flowing through the node S. In the D/A converting circuit 61, a number of switching transistors N1 to Nn are connected in parallel to the node S, and are on-off controlled by the given code signals A1 to An, respectively. Therefore, when the D/A conversion is carried out in the D/A converting circuit 61, if many of the code signals A1 to An change, a hazard occurs on the output node S of the D/A converting circuit 61. For example, assuming that the code is composed of 8 bits, when the code signals A1 to An change from (01111111) to (10000000), since all of the code signals change, the potential on the node S fluctuates, with the result that there occurs a hazard having the magnitude which is several times to several ten times the amount of the current change corresponding to the change of the code. This hazard directly influences the current Iout, so that the phase of the internal clock CLKI controlled by the current Iout is resultantly deviated. For example, a malfunction occurs in the data output circuits 14, and the characteristics is temporarily deteriorated Now, the phase adjusting circuit in accordance with the present invention will be described in detail with reference to FIG. 3, which is a specific circuit diagram of the D/A converter 20 included in the phase adjusting circuit shown in FIG. 2.

Figure 3:
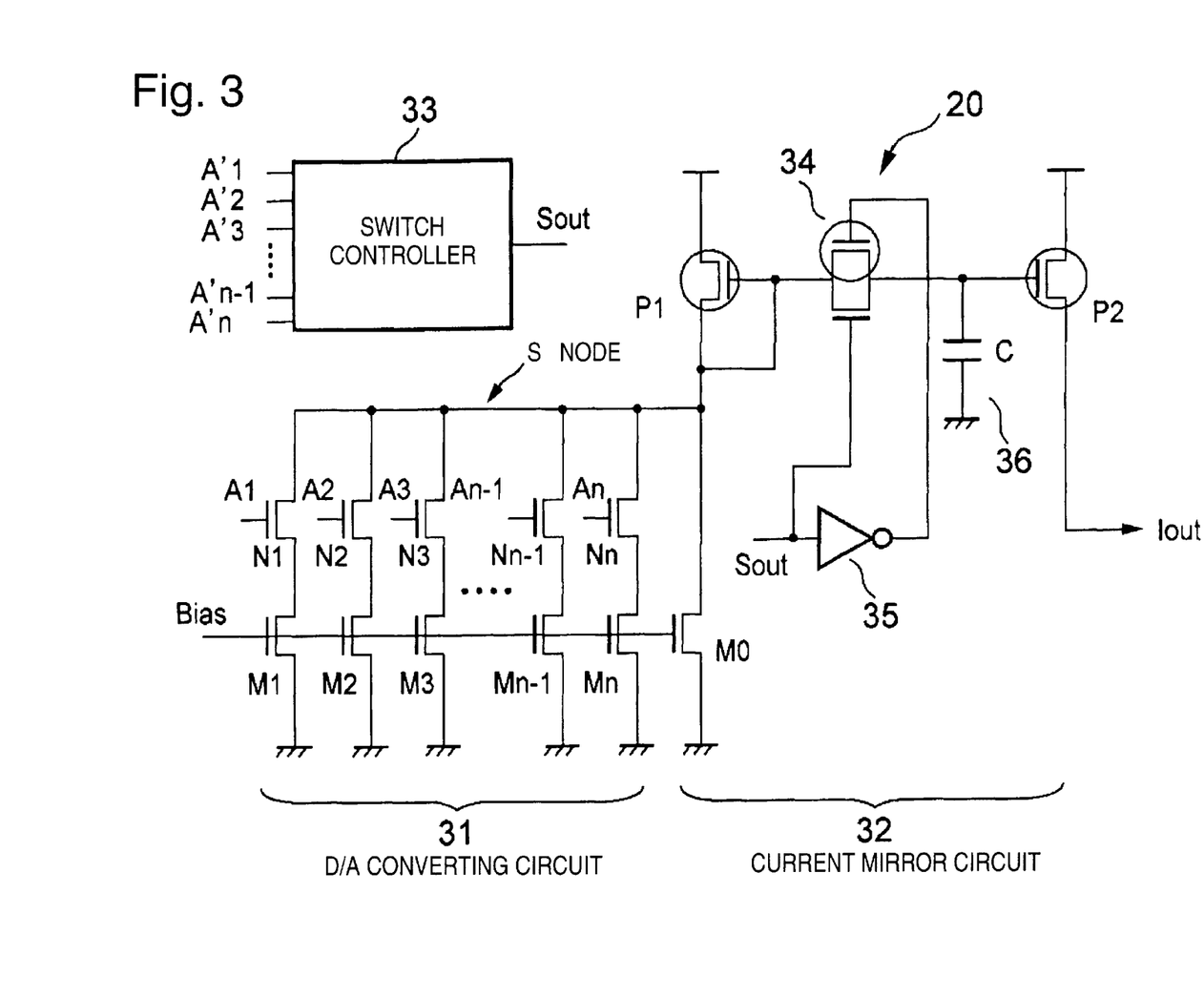
FIG. 3 is a circuit diagram of an embodiment of the D/A converter incorporated in the phase adjusting circuit in accordance with the present invention.

As shown in FIG. 3, the D/A converter 20 includes a D/A converting circuit 31 for converting the digital code expressed by the code signals A1 to An to a current flowing through a node S, and a current mirror circuit 32 for outputting the current Iout in accordance with the value of the current flowing through the node S. In the D/A converting circuit 31, a number of switching transistors N1 to Nn are connected in parallel to the node S, and a corresponding number of current control transistors M1 to Mn are connected in series to the switching transistors N1 to Nn, respectively, as shown. In addition, another current control transistor M0 is connected between the node S and the ground. A bias signal Bias of a ceaselessly constant voltage is applied to a gate of all the current control transistors M0 to Mn so as to control a current flowing through the respective current control transistors M0 to Mn. The current control transistors M1 to Mn have the gate width ratio of $1:2:4: \ldots 2^{(n-1)}$, so that the respective current values flowing through the current control transistors M1 to Mn are weighted in proportion to the gate widths of the current control transistors M1 to Mn.

The switching transistors N1 to Nn have the gate width ratio of $1:2:4: \ldots 2^{(n-1)}$, similarly to the current control transistors M1 to Mn. The switching transistors N1 to Nn have a gate connected to receive the given code signals A1 to An, respectively, so that the switching transistors N1 to Nn are individually on-off controlled by the given code signals A1 to An, respectively, to selectively allow a current defined by the corresponding current control transistor to flow through the node S. Thus, the digital code expressed by the code signals A1 to An is D/A-converted into the current flowing through the node S. The current flowing through the node S is outputted through the current mirror circuit 32 as the current Iout determined by a current driving capability ratio between an input side transistor P1 and an output side transistor P2 in the current mirror circuit 32.

The current mirror circuit 32 includes the input side transistor P1 having a gate and a drain connected in common to the node S and a source connected to a high power supply voltage, the output side transistor P2 having a drain for supplying the current Iout and a source connected to a high power supply voltage, a capacitor 36 connected between a gate of the transistor P2 and the ground, and a switch circuit 36 connected between the gate of the transistor P1 and the gate of the transistor P2. This switch circuit 36 is constituted of a transfer gate composed of an NMOS transistor and a PMOS transistor connected in parallel, as shown, and is controlled by a switch control signal Sout supplied form a switch controller 33. In brief, the switch control signal Sout is supplied to a gate of the NMOS transistor of the switch circuit 36, and is supplied through an inverter 35 to a gate of the PMOS transistor of the switch circuit 36.

The capacitor 36 has a capacitance which is enough to maintain a potential substantially equal to the potential on the node S when the switch circuit 34 is brought into an off condition, but which never substantially hinder the transfer of the potential on the node S (obtained by the D/A conversion in the D/A converting circuit 31) to the gate of the transistor P2 when the switch circuit 34 is in an on condition. The capacitor 36 may be realized by any means. For example, the capacitor 36 can be given by a separately formed capacitor or can be realized by a gate capacitance of the transistor P2.

The switch control circuit 33 receives precursory code signals A'1 to A'n generated before the code signals A1 to An outputted from the digital code generating circuit 21 to the D/A converter 20, and generates the switch control signal Sout in response to any change in the precursory code signals A'1 to A'n. Namely, before the transistors N1 to Nn actually receive the code signals A1 to An, the switch control signal Sout is activated to a low level only during a predetermined period of time.

The switch control circuit 33 can be incorporated in the digital code generating circuit 21. In this case, for example, the switch control circuit 33 incorporated in the digital code generating circuit 21 monitors signals just before buffered to be outputted as the code signals A1 to An (for example, respective inputs of output buffers for outputting the code signals A1 to An, respectively), and generates the switch control signal Sout in response to any change in the signals just before buffered to be outputted as the code signals A1 to An. Therefore, the switch control circuit 33 can be realized by any means which can activate the switch control signal Sout before the code signals A1 to An actually changes.

Figure 4:
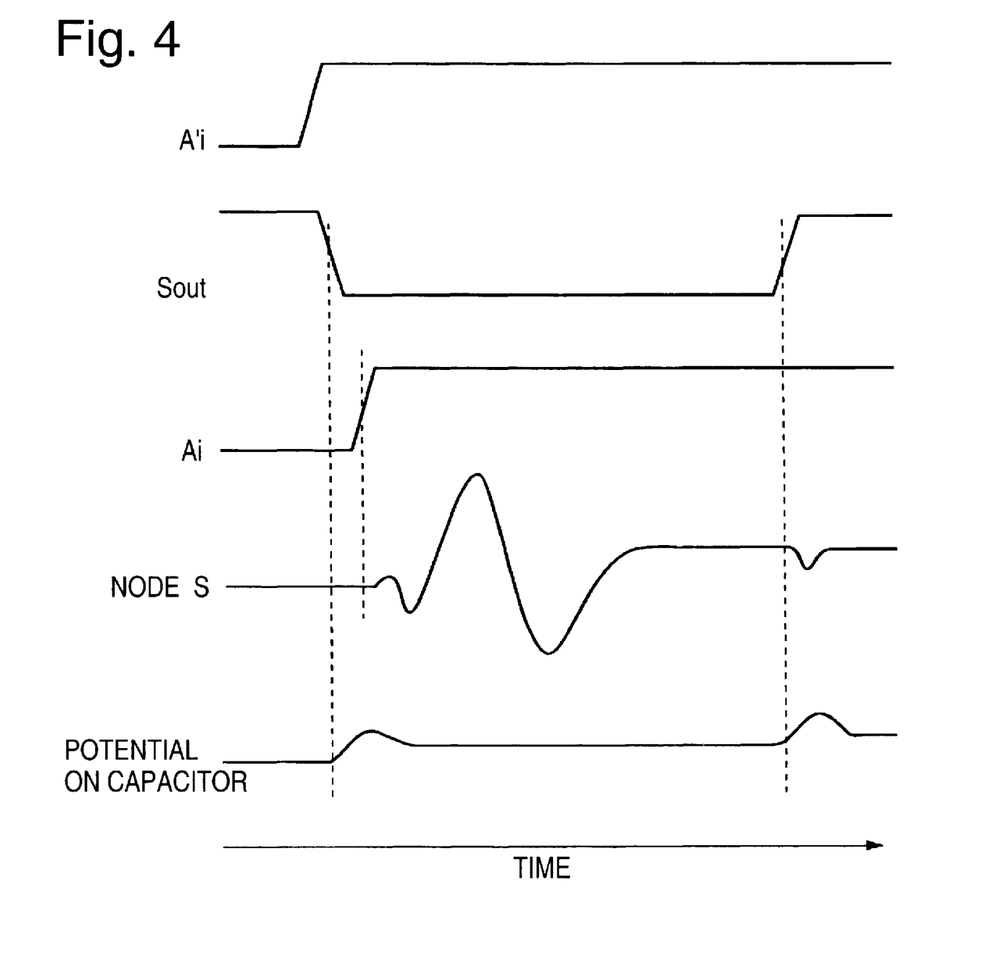
FIG. 4 is a waveform diagram for illustrating an operation of the D/A converter incorporated in the phase adjusting circuit in accordance with the present invention.

Referring to FIG. 4, there is shown a waveform diagram for illustrating an operation of the D/A converter 20 incorporated in the phase adjusting circuit 12. In FIG. 4, "A'i" representatively shows the precursory code signals A'1 to A'n, and "'Ai" representatively shows the code signals A1 to An.

As shown in FIG. 4, before the code signals "Ai" of n bits are supplied from the digital code generating circuit 21 to the D/A converting circuit 31, namely, before the code applied to the D/A converting circuit 31 changes, the switch control signal "Sout" is activated to the low level by the switch control circuit 33, as shown by "Sout" in FIG. 4. In, response to the switch control signal Sout, the switch circuit 34 is brought into the off condition and is maintained in the off condition during the predetermined period of time. After the switch circuit 34 is brought into the off condition, the code signals "Ai" are actually applied to the D/A converting circuit 31. As a result, the potential on the node S fluctuates because of the bit change in the code, as shown by "NODE S" in FIG. 4. However, since the switch circuit 34 is in the off condition, the potential on the capacitor 36 does not substantially change, as shown by "POTENTIAL ON CAPACITOR" in FIG. 4, and therefore, no hazard occurs in the current Iout. Therefore, the predetermined period of time for maintaining the switch circuit 34 in the off condition is a time required until the fluctuation of the potential on the node S is substantially settled down. For example, assuming that a repetition period of the clock signal is 50 ns, the above mentioned "predetermined period of time" is 5 ns at maximum. In addition, even if the repetition period of the clock signal is longer than 50 ns, the hazard is settled on the order of 5 ns.

During the off period of the switch circuit 34, the gate voltage of the transistor P2 is maintained by the capacitor 36 at the voltage just before the switch circuit 34 is brought into the off condition, as shown by "POTENTIAL ON CAPACITOR" in FIG. 4. Accordingly, during the off period of the switch circuit 34, the current Iout of the current mirror circuit 32 is maintained at the level just before the switch circuit 34 is brought into the off condition. After the predetermined period of time has elapsed, the switch control signal Sout is deactivated to the high level, so that the switch circuit 34 is brought into the on condition, as shown by "Sout" in FIG. 4. Accordingly, the node S is connected to the gate of the transistor P2 in the current mirror circuit 32, so that the current Iout is outputted in accordance with the newly supplied code signals A1 to An.

Incidentally, the hazard caused by the bit change depends upon the gate width of the transistor (M1 to Mn) corresponding to the changed bit. However, the hazard caused by the change in a low place bit corresponding to a transistor having a small gate width is relatively small.

Figure 5:
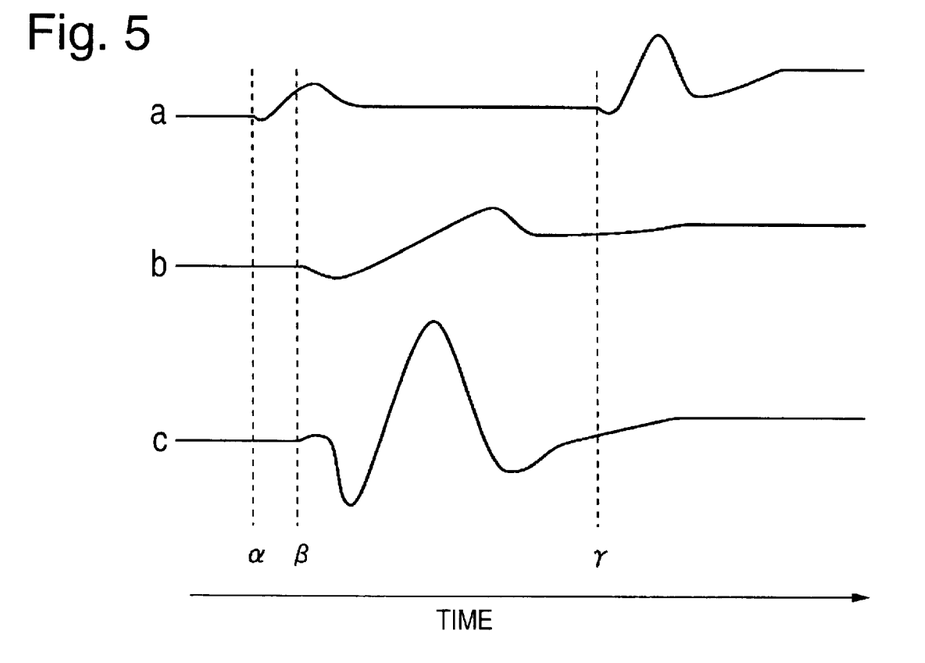
FIG. 5 is a waveform diagram for illustrating various voltage changes on the node S in the D/A converter incorporated in the phase adjusting circuit in accordance with the present invention.

Now, as shown in FIG. 5 which is a waveform diagram for illustrating various voltage changes on the node S, it is assumed that, at a time α, the switch circuit 34 is brought into the off condition, and at a time β, the bit change occurs in the output of the D/A converting circuit 21, and then, at a time γ, the switch circuit 34 is returned into the on condition. When a high place bit or bits, or many bits of the code change at one time, a large hazard occurs as shown by "c" in FIG. 5. In the other cases, however, the hazard can be effectively suppressed as shown by "a" and "b" in FIG. 5, by maintaining the switch circuit 34 in the on condition so that the potential on the node S is transferred.

In the case that the digital code generating circuit 21 is controlled by a separate clock signal (not shown), the switch control signal Sout can be generated by the separate clock signal (not shown). In this case, the switch control circuit can be omitted, so that the chip area can correspondingly be reduced, and a high speed D/A conversion for the clock signal can be realized.

The invention has thus been shown and described with reference to the specific embodiments. However, it should be noted that the present invention is in no way limited to the details of the illustrated structures but changes and modifications may be made within the scope of the appended claims.

What is claimed is:

1. A phase adjusting circuit comprising a differential amplifier receiving an external input signal and having a controllable current source, a delay means for delaying an output signal of said differential amplifier by a predetermined length of time, a comparator for phase-comparing said external input signal with said output signal delayed by said delay means, a digital code generating circuit receiving a comparison result from said comparator for generating a digital code composed of a plurality of bits, and a D/A converter receiving said digital code for generating a control signal to said controllable current source, wherein said D/A converter outputs a first control signal corresponding to a first digital code outputted from said digital code generating circuit, and when said first digital code changes to a second digital code, said D/A converter maintains said first control signal for a predetermined period of time, and then, outputs a second control signal corresponding to said second digital code after said predetermined period of time has elapsed.

2. A phase adjusting circuit claimed in claim 1 wherein said D/A converter includes an D/A converting means for outputting an analog signal corresponding to said digital code, and a current mirror circuit receiving said analog signal, wherein during said predetermined period of time after said first digital code changes to said second digital code, said current mirror circuit outputs a first output current corresponding to a first analog signal outputted from said D/A converting means in accordance with said first digital code, and after said predetermined period of time has elapsed, said current mirror circuit outputs a second output current corresponding to a second analog signal outputted from said D/A converting means in accordance with said second digital code.

3. A phase adjusting circuit claimed in claim 2 wherein said current mirror circuit includes a switch circuit connected between a gate of an input side transistor and a gate of an output side transistor and a capacitor connected to said gate of said output side transistor, said switch circuit being maintained into an off condition during said predetermined period of time so that a potential held in said capacitor is supplied to said gate of said output side transistor, with the result that said first output current corresponding to said potential held in said capacitor is outputted from said current mirror circuit.

4. A semiconductor memory comprising a memory cell array, a phase adjusting circuit receiving an external clock signal to generate an internal clock signal and having the function for adjusting the phase of said internal clock signal, a data outputting circuit for outputting data from said memory cell array in response to said internal clock signal, said phase adjusting circuit including a differential amplifier receiving said external clock signal to output said internal clock signal and having a controllable current source, a delay means for delaying said internal clock signal outputted from said differential amplifier by a delay time of said data outputting circuit, a comparator for phase-comparing said external clock signal with said internal clock signal delayed by said delay means, a digital code generating circuit receiving a comparison result from said comparator for generating a digital code composed of a plurality of bits, and a D/A converter receiving said digital code for generating a control signal to said controllable current source of said differential amplifier, wherein said D/A converter outputs a first control signal corresponding to a first digital code outputted from said digital code generating circuit, and when the first digital code changes to a second digital code, said D/A converter maintains the first control signal for a predetermined period of time, and then, outputs a second control signal corresponding to the second digital code after said predetermined period of time has elapsed.

5. A phase adjusting circuit comprising an internal clock generating means receiving an external clock signal for generating an internal clock signal, a comparator for phase-comparing said external clock signal with said internal clock signal, and a control means receiving a comparison result of said comparator, for controlling said internal clock generating means so that said external clock signal and said internal clock signal have a predetermined relation to each other, wherein when said comparison result of said comparator changes, said control means controls said internal clock generating means, for a predetermined period of time, on the basis of said comparison result from said comparator before said comparison result of said comparator changes, and then, after said predetermined period of time has elapsed, said control means controls said internal clock generating means on the basis of said comparison result from said comparator after said comparison result of said comparator changes.

6. A phase adjusting circuit claimed in claim 5 wherein said control means comprises a digital code generating circuit receiving said comparison result of said comparator for generating a digital code, a D/A converter receiving said digital code for generating an analog signal, a supplying means for supplying said analog signal to said internal clock generating means, and a notifying means for generating a signal notifying that said comparison result of said comparator changes, wherein when said supplying means receives said notifying signal, said supplying means temporarily stops the supplying of said analog signal for said predetermined period of time after said comparison result of said comparator has changed.

7. A phase adjusting circuit claimed in claim 5 wherein said supplying means includes an input transistor allowing a current corresponding to said analog signal to flow therethrough, and an output transistor having a gate connected through a transfer gate to a gate of said input transistor, wherein said transfer gate is put in an off condition for said predetermined period of time, after said supplying means receives said notifying signal.

8. A phase adjusting circuit claimed in claim 7 wherein a capacitor is connected to said gate of said output transistor.

* * * * *